US012550277B2

(12) United States Patent
Lin (10) Patent No.: US 12,550,277 B2
(45) Date of Patent: Feb. 10, 2026

(54) PUSH-PULL ROTATING MECHANISM AND LATCH DEVICE HAVING THE SAME

(71) Applicant: Fulian Precision Electronics (Tianjin) Co., LTD., Tianjin (CN)

(72) Inventor: Jia-Feng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 293 days.

(21) Appl. No.: 18/544,793

(22) Filed: Dec. 19, 2023

(65) Prior Publication Data

US 2025/0016946 A1 Jan. 9, 2025

(30) Foreign Application Priority Data

Jul. 5, 2023 (CN) .......................... 202310820064.5

(51) Int. Cl.
*H05K 7/14* (2006.01)
*F16B 5/06* (2006.01)

(52) U.S. Cl.
CPC ......... *H05K 7/1401* (2013.01); *F16B 5/0621* (2013.01); *H05K 7/1489* (2013.01)

(58) Field of Classification Search
CPC ....... G06F 1/186; G06F 1/187; H05K 7/1401; H05K 7/1402; H05K 7/1409; H05K 7/1487; H05K 7/1488; H05K 7/1489; H05K 5/023; H05K 5/0221; Y10T 403/591; Y10T 403/59; Y10T 403/595; F16B 2/18; F16B 2/185; F16B 5/008; F16B 5/0084; F16B 5/0642
See application file for complete search history.

(56) References Cited

U.S. PATENT DOCUMENTS

| | | | | |
|---|---|---|---|---|
| 4,213,666 A * | 7/1980 | Braginetz | ........ | H01R 13/62905 439/341 |
| 6,568,876 B2 * | 5/2003 | Augustin | ............. | B23Q 9/0064 403/374.5 |
| 8,096,627 B2 * | 1/2012 | Lin | ........................ | E05B 65/006 312/325 |
| 8,435,057 B1 * | 5/2013 | Jun | ...................... | H05K 7/1409 439/157 |
| 8,641,313 B1 * | 2/2014 | Crippen | ............... | H05K 5/0221 403/322.1 |
| 9,370,118 B2 * | 6/2016 | Li | ........................ | H05K 7/1409 |
| 10,136,547 B1 * | 11/2018 | Cecire | ................ | H05K 7/20736 |
| 10,327,547 B1 * | 6/2019 | Shih | ........................ | A47B 88/48 |
| 10,368,460 B1 * | 7/2019 | Yang | .................... | H05K 7/1411 |

(Continued)

*Primary Examiner* — Daniel J Wiley
(74) *Attorney, Agent, or Firm* — ScienBiziP, P.C.

(57) ABSTRACT

A push-pull rotating mechanism includes a first fixing member and a pulling member, a rotating member both disposed on the fixing member, a connecting member connects the first fixing member the rotating member. The first fixing member comprises a first side plate and a second side plate connected to the first side plate. The pulling member is movably disposed on one side of the first side plate facing the second side plate. The rotating member is rotatably disposed on one side of the second side plate facing the first side plate. The connecting member includes a connecting plate and a steering plate, one end portion of the connecting plate is connected to the pulling member. The steering plate is movably connected between the other end portion of the connecting plate and the rotating member.

20 Claims, 6 Drawing Sheets

(56) References Cited

U.S. PATENT DOCUMENTS

| | | | | |
|---|---|---|---|---|
| 10,383,248 B1* | 8/2019 | Chen | | H05K 7/18 |
| 10,537,040 B1* | 1/2020 | Yeh | | H05K 7/1489 |
| 10,607,658 B1* | 3/2020 | Qian | | G11B 33/022 |
| 10,667,424 B2* | 5/2020 | Lin | | H05K 7/1411 |
| 11,026,342 B2* | 6/2021 | Huang | | H05K 7/1487 |
| 11,576,273 B2* | 2/2023 | Li | | H05K 5/023 |
| 2002/0028105 A1* | 3/2002 | Augustin | | B23Q 9/0064 |
| | | | | 403/116 |
| 2005/0014403 A1* | 1/2005 | Joist | | H05K 7/1409 |
| | | | | 439/157 |
| 2006/0012965 A1* | 1/2006 | Beall | | H05K 7/1409 |
| | | | | 361/726 |
| 2007/0002550 A1* | 1/2007 | Strmiska | | H05K 7/1409 |
| | | | | 361/798 |
| 2007/0258224 A1* | 11/2007 | Fang | | H05K 7/1409 |
| | | | | 361/759 |
| 2009/0058236 A1* | 3/2009 | Lin | | E05B 65/006 |
| | | | | 292/332 |
| 2011/0279973 A1* | 11/2011 | Terwilliger | | H05K 7/1489 |
| | | | | 312/223.2 |
| 2011/0316403 A1* | 12/2011 | Peng | | H05K 7/1401 |
| | | | | 312/326 |
| 2013/0107424 A1* | 5/2013 | Thomas | | H05K 7/1489 |
| | | | | 361/679.01 |
| 2014/0044480 A1* | 2/2014 | Crippen | | H05K 7/1487 |
| | | | | 403/322.4 |
| 2014/0254086 A1* | 9/2014 | Li | | H05K 7/1489 |
| | | | | 439/64 |
| 2016/0228316 A1* | 8/2016 | Hoel | | A61G 13/10 |
| 2017/0045921 A1* | 2/2017 | Norton | | H05K 7/1487 |
| 2018/0054908 A1* | 2/2018 | Lu | | H05K 7/1487 |
| 2019/0174648 A1* | 6/2019 | Lin | | H05K 7/1489 |
| 2020/0068726 A1* | 2/2020 | Hwang | | E05C 19/16 |
| 2020/0112774 A1* | 4/2020 | Lee | | H04Q 1/025 |
| 2021/0270056 A1* | 9/2021 | Tower | | E05B 9/02 |
| 2021/0345507 A1* | 11/2021 | Wang | | G06F 1/185 |
| 2021/0404212 A1* | 12/2021 | Tseng | | E05C 3/045 |
| 2022/0061180 A1* | 2/2022 | Chang | | H05K 7/1487 |
| 2022/0418139 A1* | 12/2022 | Wang | | G06F 1/187 |
| 2023/0041984 A1* | 2/2023 | Spiegelman | | E05C 3/14 |
| 2023/0085091 A1* | 3/2023 | Tan | | H05K 7/1489 |
| | | | | 29/760 |
| 2024/0295257 A1* | 9/2024 | Lin | | F16B 2/185 |
| 2024/0407124 A1* | 12/2024 | Lin | | H05K 7/1401 |

* cited by examiner

PUSH-PULL ROTATING MECHANISM AND LATCH DEVICE HAVING THE SAME

FIELD

The subject matter herein generally relates to mechanical rotating mechanism, and more particularly, to a push-pull rotating mechanism and a latch device having the push-pull rotating mechanism.

BACKGROUND

A server can be movably mounted in a server cabinet, and a latch mechanism is disposed between a housing of the server and the server cabinet. The latch mechanism mainly includes a handle and a latch hook connected to the handle. The handle, which is rotated by a user, can drive the latch hook to rotate, so that the latch hook can engage the housing with or disengage the housing from the server cabinet.

However, the handle is designed to be long for effort-saving purpose, which results in a larger space occupied by the rotating handle and is not conducive to actual operation.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous members. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to;" it specifically indicates open-ended inclusion or membership in the so-described combination, group, series, and the like.

Figure 1:
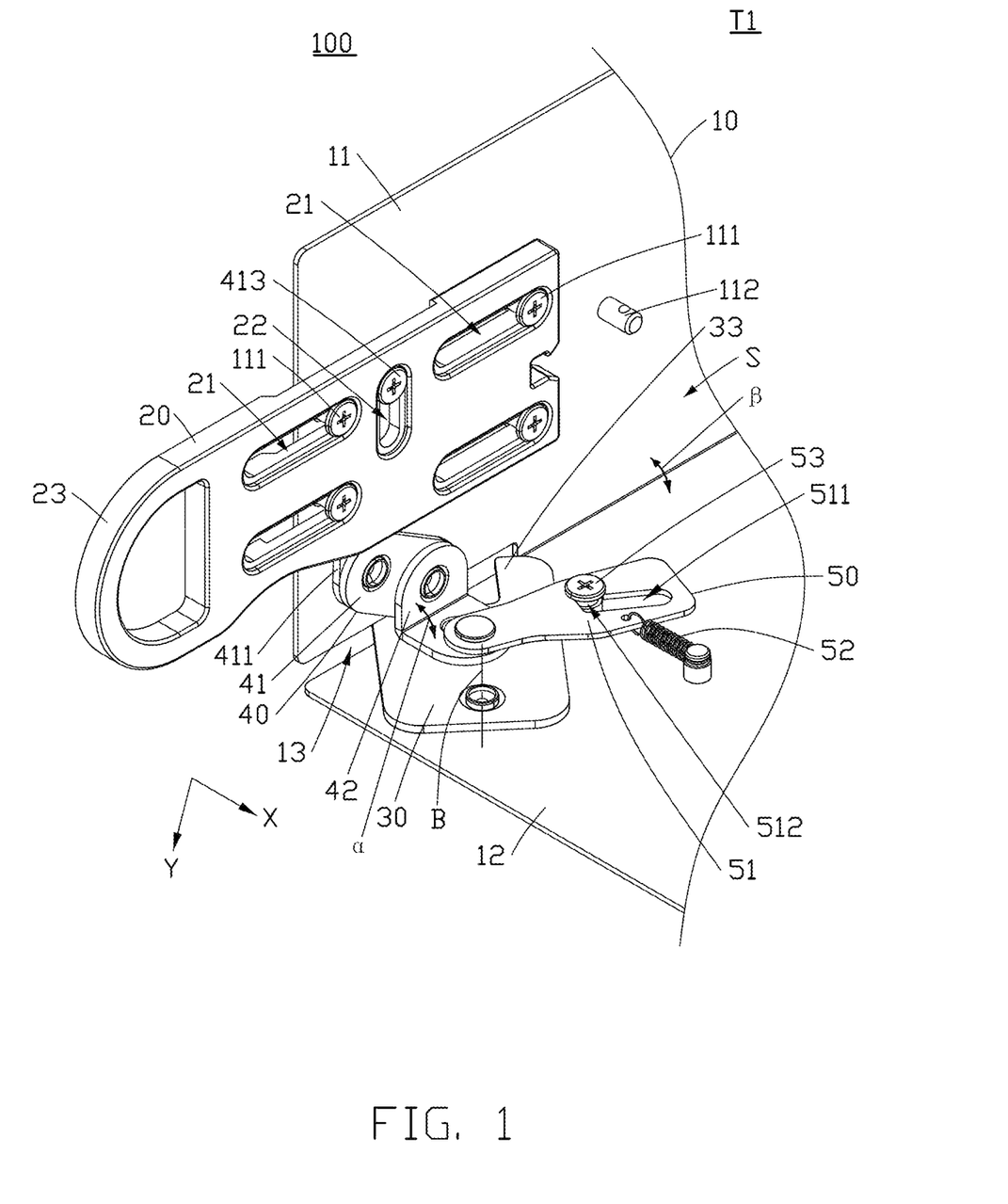
FIG. 1 is a diagrammatic view of a pull-push rotating mechanism according to an embodiment of the present disclosure, wherein the pull-push rotating mechanism is in a first state.
Figure 6:
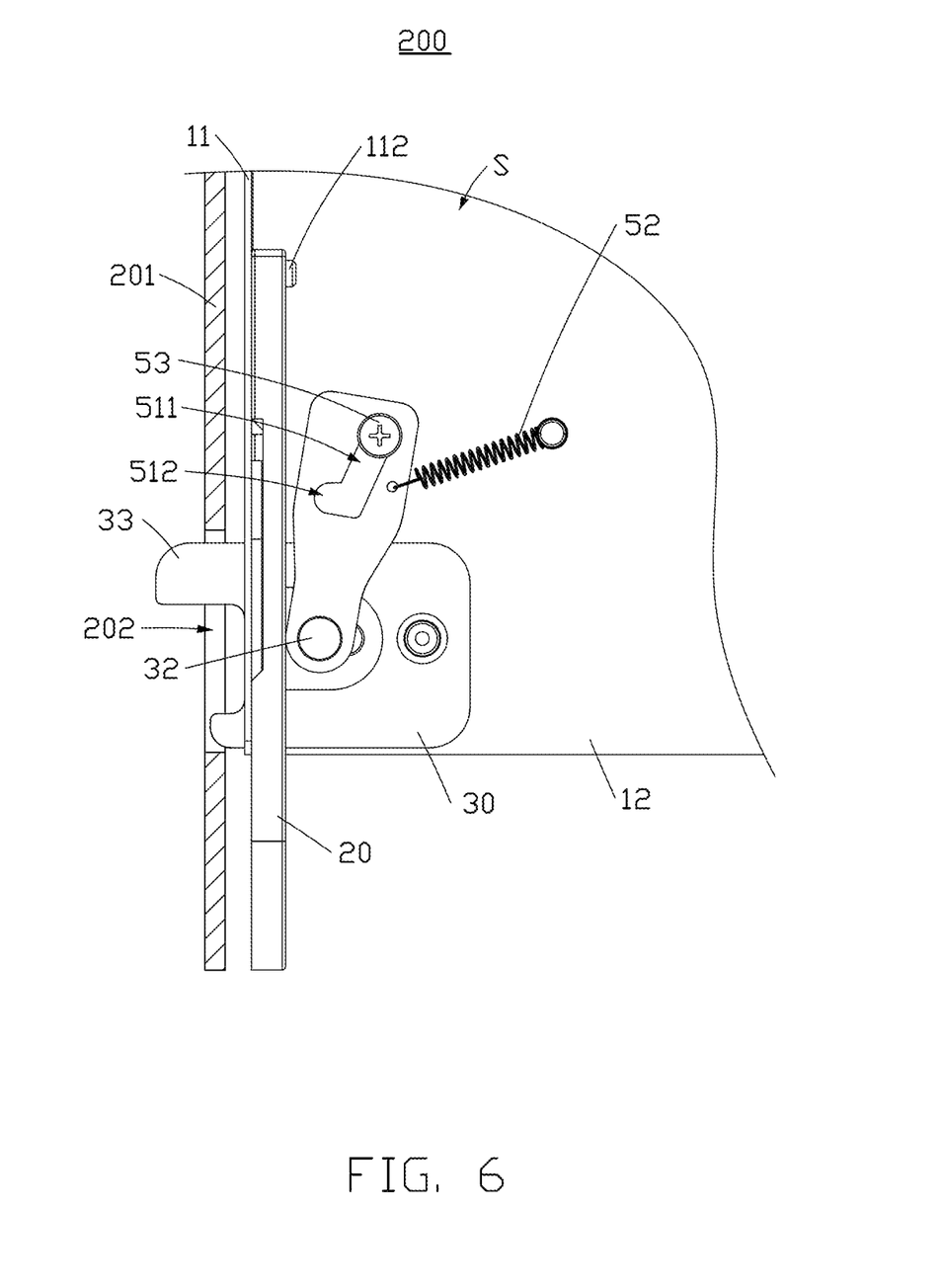
FIG. 6 is a diagrammatic view of a latch device according to an embodiment of the present disclosure.

Referring to FIGS. 1 and 6, an embodiment of the present application provides a pull-push rotating mechanism 100, which can be used in a housing of a server. This structure facilitates the engagement and disengagement of the housing with a server cabinet. In other embodiments of this disclosure, the pull-push rotating mechanism 100 can also be used in a connection structure of other electronic device, such as the connection structure between a slot and housing of a desktop computer, or the connection structure between a transformer winding and the housing of the transformer.

Figure 2:
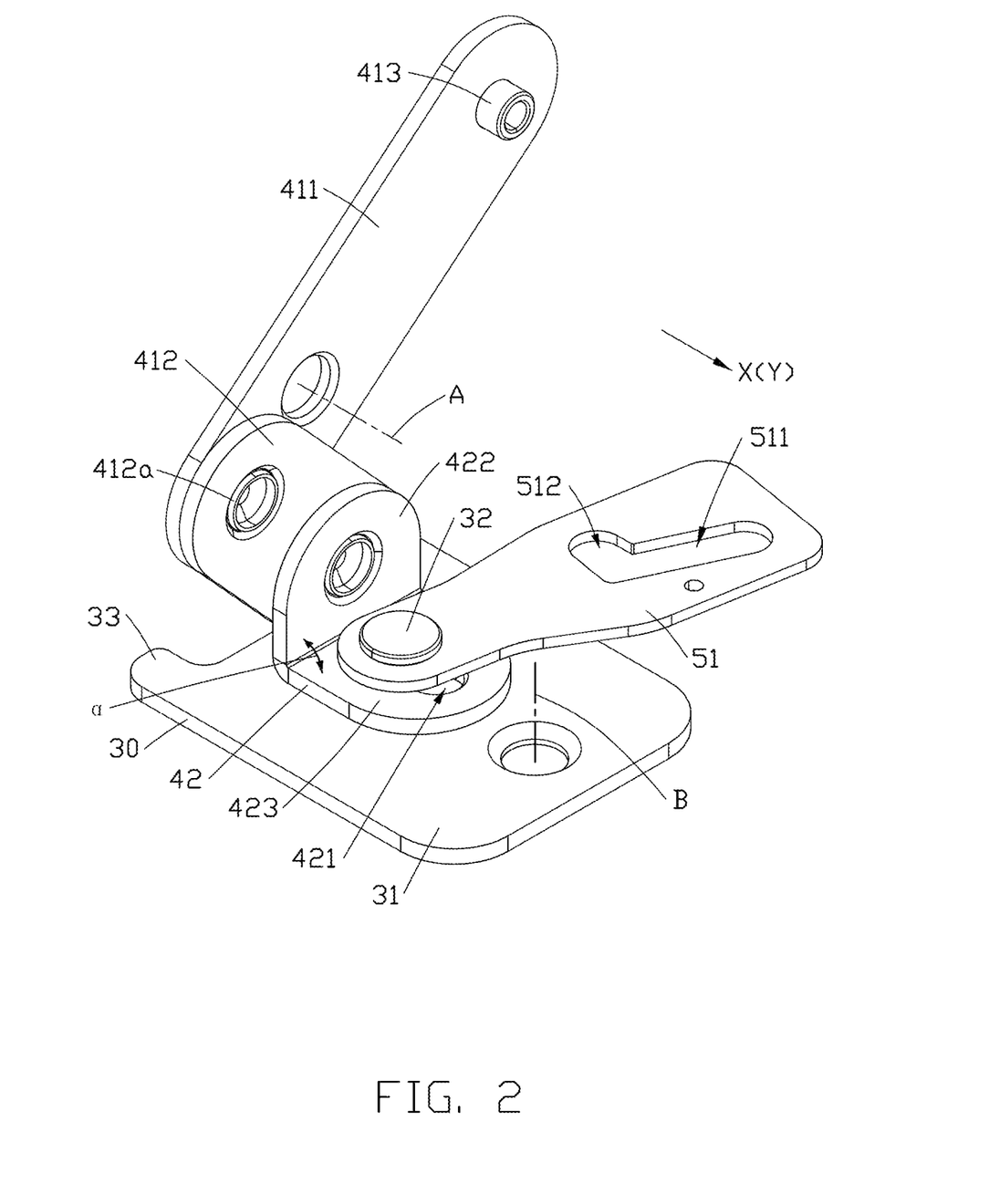
FIG. 2 is a diagrammatic view of the pull-push rotating mechanism in FIG. 1 after a first fixing member is removed.

Referring to FIGS. 1 and 2, the pull-push rotating mechanism 100 includes a first fixing member 10, a pulling member 20, a rotating member 30, and a connecting member 40. The pulling member 20, the rotating member 30, and the connecting member 40 are all arranged on the first fixing member 10. The connecting member 40 connects the pulling member 20 and the rotating member 30, enabling the rotating member 30 to rotate when the pulling member 20 moves.

The first fixing member 10 includes a first side plate 11 and a second side plate 12. The first side plate 11 is connected to the second side plate 12 to form an accommodating space S. The accommodating space S may be used for receiving at least one hard drive therein.

The pulling member 20 is movably connected on one side of the first side plate 11 towards the accommodating space S, and the rotating member 30 is rotatably connected on one side of the second side plate 12 towards the accommodating space S. The connecting member 40 includes a connecting plate 41 and a steering plate 42. One end of the connecting plate 41 is connected to the pulling member 20, and the steering plate 42 is movably connected between the other end of the connecting plate 41 and the rotating member 30. The connecting plate 41 is used to change a moving direction of the pulling member 20 as the pulling member 20 can drive the steering plate 42 to move the connecting plate 41. The steering plate 42 is also used to change a moving direction of the connecting plate 41 as the connecting plate 41 can drive the rotating member 30 to rotate the steering plate 42.

Referring to FIGS. 1 and 2, in this embodiment, the connecting plate 41 includes a first portion 411 and a second portion 412 movably connected to the first portion 411. One end of the first portion 411, which is away from the second portion 412, connects to the pulling member 20. The middle part of the first portion 411 is rotatably connected to the first side plate 11 around a first axis A. One end of the second portion 412, which is away from the first portion 411, connects to the steering plate 42.

The first portion 411 is substantially a thin plate, and the second portion 412 is also substantially a thin plate. One end of the first portion 411 is rotatably connected to one end of the second portion 412 by a shaft 412a, thereby forming a structure similar to a movable joint. Meanwhile, the middle part of the first portion 411 is rotatably connected to the first side plate 11 by another pin (not shown), enabling the first portion 411 to rotate around the first axis A.

Figure 3:
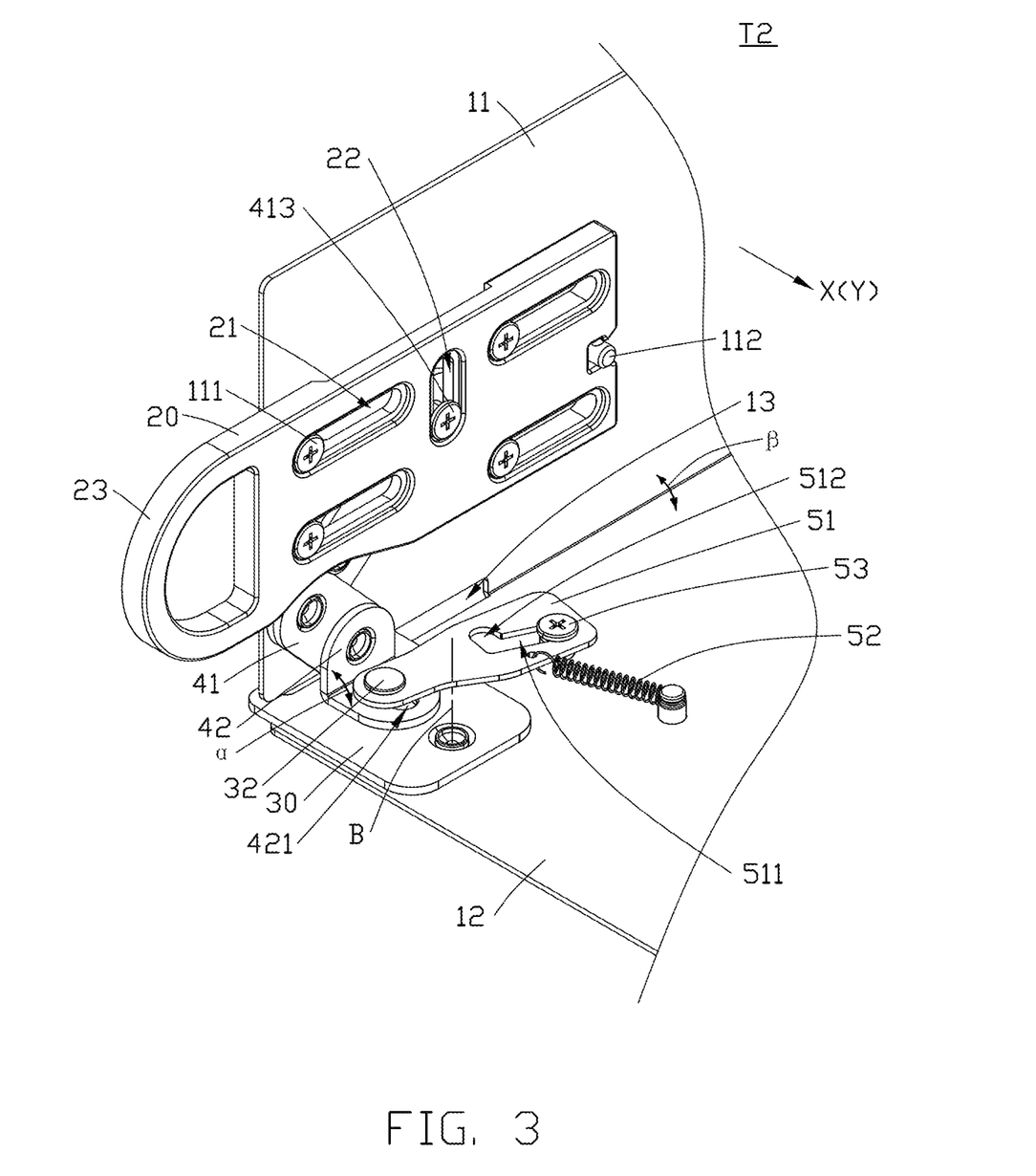
FIG. 3 is similar to FIG. 1, but showing the pull-push rotating mechanism in a second state.

Referring to FIGS. 1, 2, and 3, in this embodiment, the rotating member 30 includes a rotating body 31 and a first slider 32 protruding from a surface of the rotating body 31 towards the steering plate 42. The rotating body 31 is rotatably connected to the second side plate 12 around a second axis B, and the steering plate 42 is provided with a first slide slot 421. One end of the first slider 32 far from the rotating body 31 movably passes through the first slide slot 421. The first slide slot 421 has an extension direction, which is defined as a first direction X, and a direction from the first slider 32 to the second axis B is defined as a second direction Y. The first direction X is not perpendicular to the second direction Y, thereby ensuring that the steering plate 42 can drive the first slider 32 to move through the first slide slot 421 during a movement process, and the moving first slider 32 can drive the rotating body 31 to rotate around the second axis B. If the first direction X is perpendicular to the second direction Y, a force applied on the first slider 32 by the first slide slot 421 may pass through the second axis B, which cannot drive the rotating body 31 to rotate.

Referring to FIGS. 1 and 3, in this embodiment, the first side plate 11 protrudes towards the pulling member 20 to form multiple second sliders 111. The pulling member 20 is provided with multiple second slide slots 21 corresponding to the second sliders 111. Each of the second sliders 111 can be movably inserted into a corresponding one of the second slide slots 21, allowing the pulling member 20 to move back and forth in the extension direction of the second slide slots 21.

Referring to FIGS. 2 and 3, in this embodiment, the first portion 411 protrudes towards the pulling member 20 to form a third slider 413. The second portion 412 is rotatably connected to one side of the steering plate 42. The pulling member 20 is provided with a third slide slot 22 corresponding to the third slider 413, and the third slider 413 can be movably inserted into the third slide slot 22. An extension direction of the third slide slot 22 is different from an extension direction of the second slide slot 21, thereby changing a transmission direction of the pulling member 20 to the connecting plate 41.

Referring to FIGS. 1 and 2, in this embodiment, the first side plate 11 and the second side plate 12 form a first angle α. The steering plate 42 includes a first steering portion 422 connecting the second portion 412 and a second steering portion 423 connecting the rotating body 31. The first slide slot 421 is set in the second steering portion 423. The first steering portion 422 and the second steering portion 423 form a second angle β, which is approximately the same as the first angle α, thereby helping to reduce the internal stress suffered by the connecting plate 41 and the steering plate 42 during movement. In this embodiment, both the first angle α and the second angle β are 90 degrees.

Referring to FIGS. 1 and 3, in this embodiment, the pull-push rotating mechanism 100 further includes a sliding lock member 50 disposed on the second side plate 12. The sliding lock member 50 includes a card plate 51 connecting the second steering portion 423, an elastic member 52, and a first limiting column 53. One end of the elastic member 52 is fixed to the second side plate 12. One end of the first limiting column 53 is also fixed to the second side plate 12. The card plate 51 is provided with a first limit slot 511 and a second limit slot 512 communicating with the first limit slot 511. An extension direction of the first limit slot 511 is different from an extension direction of the second limit slot 512. The other end of the first limiting column 53 can be movably set in the first limit slot 511 or the second limit slot 512, and the other end of the elastic member 52 is connected to the card plate 51. The card plate 51 is sleeved on a portion of the first slider 32 passing through the first slide slot 421. Due to the different extension directions of the first limit slot 511 and the second limit slot 512, when the first limiting column 53 slides from the first limit slot 511 into the second limit slot 512, the first limiting column 53 is limited by the second limit slot 512, thereby preventing the rotating body 31 from further rotating clockwise. In this embodiment, the elastic member 52 is a spring.

Referring to FIGS. 1 and 3, in this embodiment, the first side plate 11 also protrudes towards the pulling member 20 to form a second limiting column 112. The second limiting column 112 is used to abut against the end of the pulling member 20, preventing the pulling member 20 from further moving, thereby preventing the rotating body 31 from further rotating counterclockwise. That is, the rotating body 31 can only rotate within a predetermined range.

Figure 4:
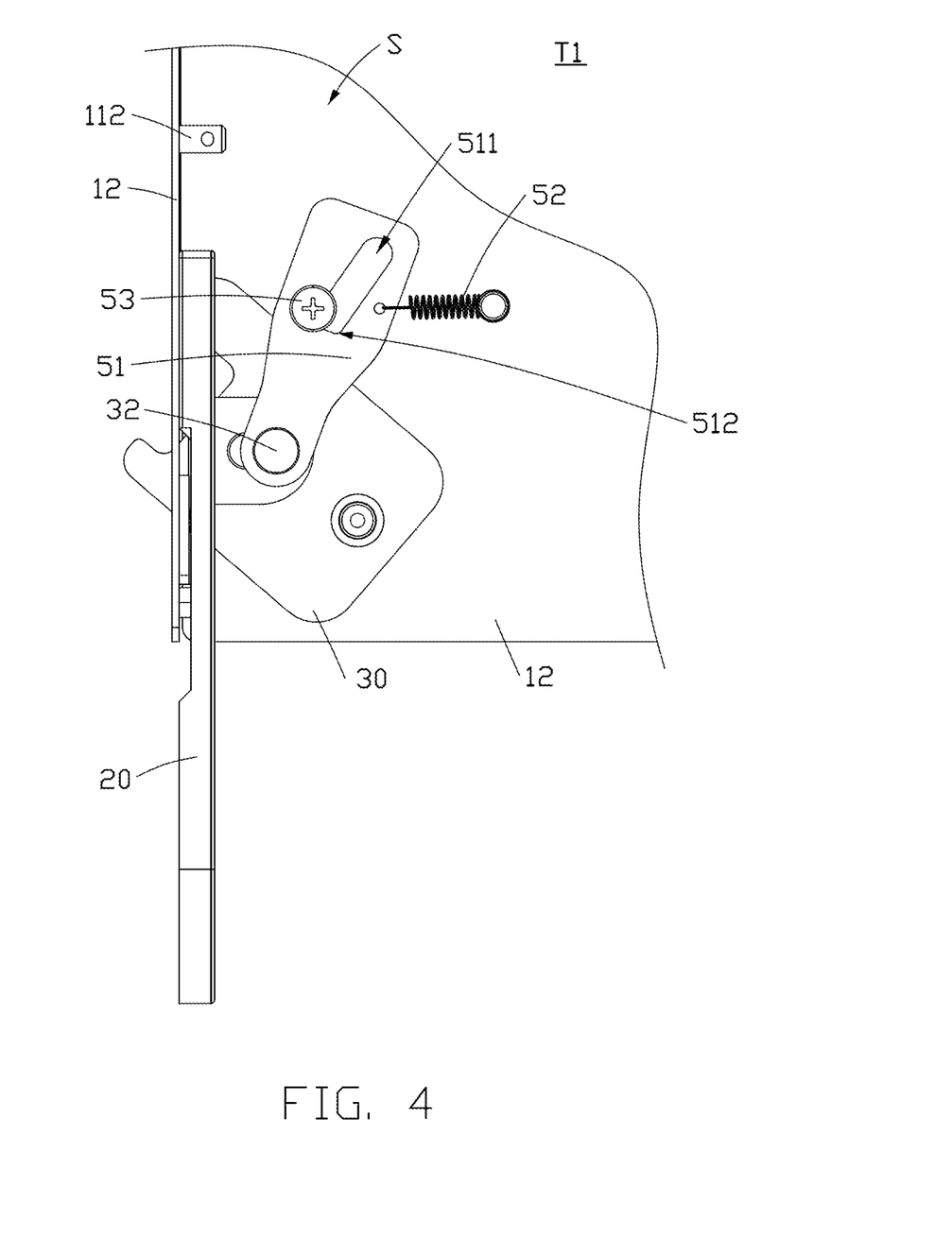
FIG. 4 is a top view of the pull-push rotating mechanism in the first state in FIG. 1.

Referring to FIGS. 2 and 4, in this embodiment, the rotating member 30 further includes a hook portion 33 extending from one side of the rotating body 31. A first slot 13 is defined at a connection area of the first side plate 11 and the second side plate 12. When the rotating body 31 rotates within the predetermined range, the hook portion 33 can rotate into and pass through the first slot 13 and then protrude outside the accommodating space S. Alternatively, the hook portion 33 can rotate out and pass back through the first slot 13 and then received in the accommodating space S again.

Referring to FIGS. 1 and 3, in this embodiment, the pulling member 20 is provided with a handle 23 at an end away from the second limiting column 112, which can facilitate the operator to grip, thereby improving the efficiency of moving the pulling member 20.

In this embodiment, the pull-push rotating mechanism 100 may work in two states, namely, a first state T1 and a second state T2.

Referring to FIGS. 1 and 4, the first state T1 is that the pulling member 20 moves in a direction away from the second limit post 112, driving the first portion 411 to rotate in a direction through the interaction between the third sliding slot 22 and the third sliding post 413. This rotation of the first portion 411 causes the second portion 412 to rotate, which in turn drives the steering plate 42 to move in a direction approximately opposite to the moving direction of the pulling member 20. The steering plate 42, by interacting with the first sliding slot 421 and the first sliding post 32, drives the rotating body 31 to rotate counterclockwise. The rotating body 31 then moves the hook portion 33 into the first slot 13 and back into the accommodating space S. In the first state T1, the first limit post 53 can be movably accommodated within the second limit slot 512.

Figure 5:
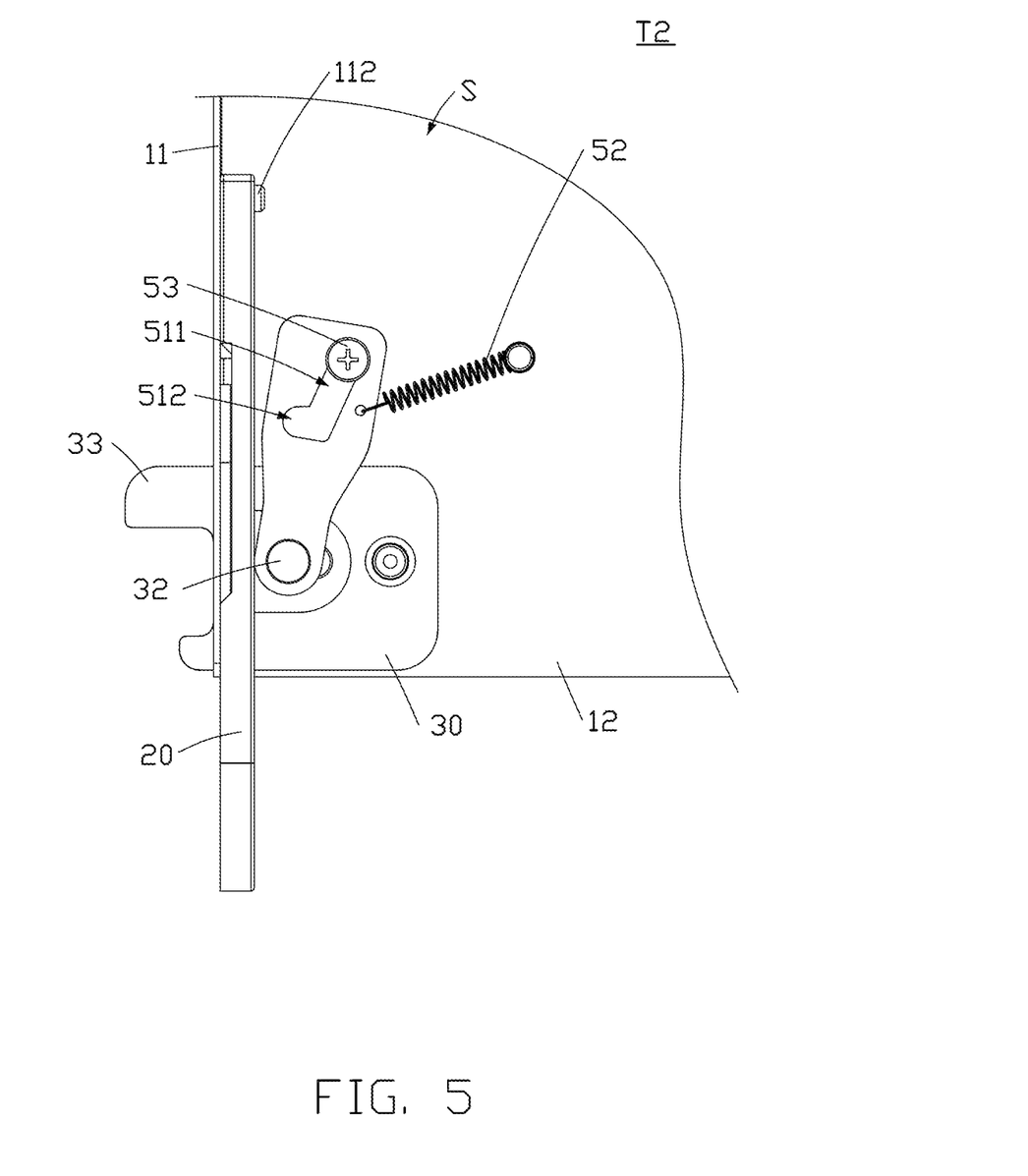
FIG. 5 is a top view of the pull-push rotating mechanism in the second state in FIG. 1.

Referring to FIGS. 3 and 5, the second state T2 is that the pulling member 20 moves towards the second limit post 112, driving the first portion 411 to rotate in an opposite direction through the interaction between the third sliding slot 22 and the third sliding post 413. This rotation causes the second portion 412 to rotate, which drives the steering plate 42 to move in the same direction as the pulling member 20. The steering plate 42, by interacting with the first sliding slot 421 and the first sliding post 32, drives the rotating body 31 to rotate clockwise. The rotating body 31 moves the hook portion 33 through the first slot 13b and out of the accommodating space S, until the second limit post 112 abuts against the pulling member 20 and prevents the pulling member 20 to further rotate. In the second state T2, the first limit post 53 can be movably accommodated within the first limit slot 511.

In the pull-push rotating mechanism 100, the connecting member 40 arranged between the pulling member 20 and the rotating member 30 can change the moving direction of the pulling member 20. As a result, a linear motion of the pulling member 20 can drive the rotating member 30 to rotate, thereby saving operational space and enhancing convenience.

Referring to FIG. 6, this embodiment further provides a latch device 200. The latch device 200 includes a second fixing member 201 and the pull-push rotating mechanism 100. The second fixing member 201 is provided with a second slot 202, which corresponds to the first slot 13. The hook portion 33 can pass through the first slot 13 and extend into the second slot 202, achieving engagement between the first fixing member 10 and the second fixing member 201. In use, the pull-push rotating mechanism 100 is first in the first state T1, which is aligned with the second fixing member 201, thereby allowing the first slot 13 to correspond to the second slot 202. Then, the pull-push rotating mechanism 100 is switched from the first state T1 to the second state T2, allowing the hook portion 33 to pass through the first slot 13 and extend into the second slot 202, completing the engagement between the pull-push rotating mechanism 100 and the second fixing member 201.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A push-pull rotating mechanism comprising:
   a first fixing member comprising a first side plate and a second side plate connected to the first side plate;
   a pulling member movably connected to one side of the first side plate facing the second side plate;
   a rotating member rotatably connected to one side of the second side plate facing the first side plate; and
   a connecting member connecting the pulling member and the rotating member,
   wherein the connecting member comprises a connecting plate and a steering plate, one end portion of the connecting plate is connected to the pulling member, and the steering plate is movably connected between the other end portion of the connecting plate and the rotating member.

2. The push-pull rotating mechanism of claim 1, further comprising a sliding lock member disposed on the second side plate, wherein the sliding lock member comprises a card plate, an elastic member, and a first limiting column, the card plate is connected to the rotating member, one end portion of the elastic member and one end portion of the first limiting column are fixed to the second side plate, the card plate defines a first limit slot and a second limit slot communicating with the first limit slot, the other end portion of the first limiting column is movably disposed in the first limit slot or the second limit slot, and the other end portion of the elastic member is connected to the card plate.

3. The push-pull rotating mechanism of claim 2, wherein an extension direction of the first limit slot is different from that of the second limit slot.

4. The push-pull rotating mechanism of claim 2, wherein the rotating member comprises a rotating body and a first slider protruding from the rotating body, the rotating body is rotatably connected to the second side plate around a first axis, the steering plate defines a first slide slot, one end portion of the first slider away from the rotating body movably passes through the first slide slot, and the card plate is sleeved on the end portion of the first slider.

5. The push-pull rotating mechanism of claim 4, wherein the first slide slot extends along a first direction, a second direction is defined as a direction from the first slider to the first axis, and the first direction is not perpendicular to the second direction.

6. The push-pull rotating mechanism of claim 4, wherein a first slot is defined at a connection area of the first side plate and the second side plate, the rotating member further comprises a hook portion, the hook portion extends from one side of the rotating body, and the hook portion passes through the first slot.

7. The push-pull rotating mechanism of claim 1, wherein the first side plate protrudes towards the pulling member to form a plurality of second sliders, the pulling member defines a plurality of second slide slots, and each of the plurality of second sliders is movably inserted into a corresponding one of the plurality of second slide slots.

8. The push-pull rotating mechanism of claim 7, wherein the connecting plate comprises a first portion and a second portion movably connected to the first portion, the first portion protrudes towards the pulling member to form a third slider, the second portion is rotatably connected to one side of the steering plate, the pulling member defines a third slide slot, and the third slider is movably inserted into the third slide slot.

9. The push-pull rotating mechanism of claim 8, wherein an extension direction of the third slide slot is different from an extension direction of the second slide slot.

10. The push-pull rotating mechanism of claim 1, wherein the first side plate protrudes towards the pulling member to form a second limiting column, and the second limiting column is disposed on a side of an end portion of the pulling member.

11. The push-pull rotating mechanism of claim 1, wherein the steering plate comprising a first steering portion and a second steering portion, the first steering portion is connected the other end portion of the connecting plate, and the second steering portion is connected to the rotating member.

12. The push-pull rotating mechanism of claim 11, wherein the first side plate and the second side plate form a first angle, the first steering portion and the second steering portion form a second angle, and the first angle is equal to the second angle.

13. A latch device comprising:
    a second fixing member defining a second slot, and
    a push-pull rotating mechanism comprising:
      a first fixing member comprising a first side plate and a second side plate connected to the first side plate;
      a pulling member movably connected to one side of the first side plate facing the second side plate;
      a rotating member rotatably connected to one side of the second side plate facing the first side plate; and
      a connecting member connecting the pulling member and the rotating member,
    wherein the connecting member comprises a connecting plate and a steering plate, one end portion of the connecting plate is connected to the pulling member, and the steering plate is movably connected between the other end portion of the connecting plate and the rotating member, and a portion of the rotating member passes through the first slot and the second slot.

14. The latch device of claim 13, further comprising a sliding lock member disposed on the second side plate, wherein the sliding lock member comprises a card plate, an elastic member, and a first limiting column, the card plate is connected to the rotating member, one end portion of the elastic member and one end portion of the first limiting column are fixed to the second side plate, the card plate defines a first limit slot and a second limit slot communicating with the first limit slot, the other end portion of the first limiting column is movably disposed in the first limit slot or the second limit slot, and the other end portion of the elastic member is connected to the card plate.

15. The latch device of claim 14, wherein an extension direction of the first limit slot is different from that of the second limit slot.

16. The latch device of claim 14, wherein the rotating member comprises a rotating body and a first slider protruding from the rotating body, the rotating body is rotatably connected to the second side plate around a first axis, the steering plate defines a first slide slot, one end portion of the first slider away from the rotating body movably passes through the first slide slot, and the card plate is sleeved on the end portion of the first slider.

17. The latch device of claim 16, wherein the first slide slot extends along a first direction, a second direction is defined as a direction from the first slider to the first axis, and the first direction is not perpendicular to the second direction.

18. The latch device of claim 13, wherein the first side plate protrudes towards the pulling member to form a plurality of second sliders, the pulling member defines a plurality of second slide slots, and each of the plurality of second sliders is movably inserted into a corresponding one of the plurality of second slide slots.

19. The latch device of claim 18, wherein the connecting plate comprises a first portion and a second portion movably connected to the first portion, the first portion protrudes towards the pulling member to form a third slider, the second portion is rotatably connected to one side of the steering plate, the pulling member defines a third slide slot, and the third slider is movably inserted into the third slide slot.

20. The latch device of claim 19, wherein an extension direction of the third slide slot is different from an extension direction of the second slide slot.

* * * * *